(12) United States Patent
Nguyen et al.

(10) Patent No.: US 11,164,776 B2
(45) Date of Patent: Nov. 2, 2021

(54) METALLIC INTERCONNECT STRUCTURE

(71) Applicant: International Business Machines Corporation, Armonk, NY (US)

(72) Inventors: Son Nguyen, Schenectady, NY (US); Takeshi Nogami, Schenectady, NY (US); Thomas Jasper Haigh, Jr., Claverack, NY (US); Cornelius Brown Peethala, Slingerlands, NY (US); Matthew T. Shoudy, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/588,057

(22) Filed: Sep. 30, 2019

(65) Prior Publication Data

US 2021/0098292 A1 Apr. 1, 2021

(51) Int. Cl.
*H01L 21/768* (2006.01)
*H01L 23/532* (2006.01)
(Continued)

(52) U.S. Cl.
CPC .. *H01L 21/76835* (2013.01); *H01L 21/02126* (2013.01); *H01L 21/02167* (2013.01);
(Continued)

(58) Field of Classification Search
CPC ......... H01L 21/76835; H01L 21/76877; H01L 21/02126; H01L 21/02167;
(Continued)

(56) References Cited

U.S. PATENT DOCUMENTS 6,054,379 A * 4/2000 Yau ................... H01L 21/76832
438/623
6,638,851 B2 * 10/2003 Cowley ............. H01L 21/76802
257/E21.577
(Continued)

OTHER PUBLICATIONS

S. Nguyen et al., "Pinch-off Plasma CVD Deposition Process and Material Technology for Nano-Device Air Gap/Spacer Formation," ECS Transactions, May 2018, pp. 25-39, vol. 85, No. 6.
(Continued)

*Primary Examiner* — Alexander O Williams
(74) *Attorney, Agent, or Firm* — L. Jeffrey Kelly; Ryan, Mason & Lewis, LLP

(57) ABSTRACT

A method includes forming a metallic interconnect structure on a semiconductor substrate where the metallic interconnect structure comprises a plurality of metal lines with adjacent metal lines separated by a gap therebetween. The method further includes selectively depositing a first low-k dielectric material onto the semiconductor substrate and onto exposed surfaces of the metal lines of the metallic interconnect structure to form a barrier on at least the metal lines. The barrier is configured to minimize oxidation and diffusion of metal of the metal lines. The method also includes depositing a flowable second low-k dielectric material onto the semiconductor substrate to form a dielectric layer encapsulating the barrier and the metallic interconnect structure.

19 Claims, 10 Drawing Sheets

(51) Int. Cl.
  *H01L 21/02* (2006.01)
  *H01L 23/522* (2006.01)
(52) U.S. Cl.
  CPC .... *H01L 21/02203* (2013.01); *H01L 21/7682* (2013.01); *H01L 21/76837* (2013.01); *H01L 21/76852* (2013.01); *H01L 21/76877* (2013.01); *H01L 23/5226* (2013.01); *H01L 23/5329* (2013.01); *H01L 23/53209* (2013.01); *H01L 23/53223* (2013.01); *H01L 23/53238* (2013.01); *H01L 23/53252* (2013.01); *H01L 23/53266* (2013.01)
(58) Field of Classification Search
  CPC ........... H01L 21/02203; H01L 21/7682; H01L 21/7637; H01L 21/76852; H01L 23/5226; H01L 23/53209; H01L 23/53223; H01L 23/53228; H01L 23/53252; H01L 23/53266; H01L 23/5329; H01L 21/768; H01L 21/02; H01L 23/532; H01L 23/522
  USPC .......................................................... 257/751
  See application file for complete search history.

(56) References Cited

U.S. PATENT DOCUMENTS

| | | | |
|---|---|---|---|
| 6,873,057 B2 | 3/2005 | Chen et al. | |
| 7,205,666 B2 | 4/2007 | Lee et al. | |
| 7,524,735 B1 | 4/2009 | Gauri et al. | |
| 7,531,891 B2 | 5/2009 | Ohto et al. | |
| 8,357,608 B2 | 1/2013 | Gates et al. | |
| 8,362,596 B2 | 1/2013 | Cohen et al. | |
| 8,779,600 B2 | 7/2014 | Nguyen et al. | |
| 9,040,411 B2 | 5/2015 | Grill et al. | |
| 9,312,224 B1* | 4/2016 | Canaperi | H01L 23/53238 |
| 9,777,025 B2 | 10/2017 | Girard et al. | |
| 9,853,025 B1* | 12/2017 | Yang | H01L 28/24 |
| 9,892,961 B1* | 2/2018 | Cheng | H01L 21/0217 |
| 9,934,963 B2 | 4/2018 | Nguyen et al. | |
| 9,941,211 B1* | 4/2018 | Briggs | H01L 23/53238 |
| 10,134,901 B1* | 11/2018 | Pawlak | H01L 29/66772 |
| 2004/0175929 A1* | 9/2004 | Schmitt | H01L 21/3148 |
| | | | 438/628 |
| 2008/0265416 A1* | 10/2008 | Lee | H01L 21/76883 |
| | | | 257/751 |
| 2009/0014877 A1* | 1/2009 | Chang | H01L 21/76883 |
| | | | 257/751 |
| 2010/0093168 A1* | 4/2010 | Naik | H01L 21/7682 |
| | | | 438/618 |
| 2010/0308463 A1* | 12/2010 | Yu | H01L 21/76849 |
| | | | 257/753 |
| 2013/0062753 A1* | 3/2013 | Nguyen | H01L 21/76829 |
| | | | 257/734 |
| 2013/0175697 A1* | 7/2013 | Nguyen | H01L 23/5329 |
| | | | 257/774 |
| 2014/0233200 A1* | 8/2014 | Lemke | H05K 13/00 |
| | | | 361/764 |
| 2015/0170961 A1* | 6/2015 | Romero | H01L 21/76816 |
| | | | 438/641 |
| 2015/0262929 A1* | 9/2015 | Hsiao | H01L 21/7685 |
| | | | 257/773 |
| 2017/0062355 A1* | 3/2017 | Liang | H01L 23/562 |
| 2017/0316983 A1* | 11/2017 | Lo | H01L 21/823481 |
| 2019/0027406 A1 | 1/2019 | Chu et al. | |
| 2019/0157144 A1* | 5/2019 | Lee | H01L 21/7684 |
| 2020/0006126 A1* | 1/2020 | Liou | H01L 21/02274 |
| 2020/0083345 A1* | 3/2020 | Canaperi | H01L 29/785 |
| 2020/0105910 A1* | 4/2020 | Yeong | H01L 29/66545 |
| 2020/0219765 A1* | 7/2020 | Chen | G03F 7/0757 |
| 2020/0279769 A1* | 9/2020 | Park | H01L 21/76832 |
| 2020/0286776 A1* | 9/2020 | Lanzillo | H01L 23/5329 |
| 2020/0411387 A1* | 12/2020 | Chiang | H01L 21/823842 |
| 2021/0020833 A1* | 1/2021 | Li | H01L 27/24 |
| 2021/0035862 A1* | 2/2021 | Liu | H01L 21/76849 |
| 2021/0057333 A1* | 2/2021 | Tsai | H01L 23/5283 |

OTHER PUBLICATIONS

B.D. Briggs et al., "Process Challenges in Fully Aligned Via Integration for sub 32 nm Pitch BEOL," IEEE International Interconnect Technology Conference (IITC), Jun. 4-7, 2018, p. 148.

A. Grill et al., "Progress in the Development and Understanding of Advanced Low k and Ultralow k Dielectrics for Very Large-Scale Integrated Interconnects-State of the Art," Applied Physics Reviews, Mar. 2014, 17 pages, vol. 1, No. 1.

S.V. Nguyen et al., "Initial Transient Phenomena Impact on Plasma CVD of Ultrathin Silicon Nitride and Silicon Carbon Nitride Dielectrics for Nano Devices Cu-Low k Interconnects," ECS Meeting Abstracts, Plasma Nano Science and Technology 1, http://ma.ecsdl.org/content/MA2016-2/171500.short?cited-by=yes&legid=ecsmtgabs; MA2016-02/17/150 0, Oct. 3, 2016, 3 pages.

* cited by examiner

METALLIC INTERCONNECT STRUCTURE

BACKGROUND

A semiconductor integrated circuit chip is typically fabricated with a back-end-of-line (BEOL) interconnect structure, which comprises multiple levels of metal lines and inter-level metal vias, to connect various integrated circuit components and devices that are fabricated as part of a front-end-of-line (FEOL) layer of the semiconductor integrated circuit chip. Current state of the art BEOL process technologies typically implement highly conductive metal materials to form BEOL interconnects, as the use of these materials is known to significantly reduce resistance in the BEOL interconnect structure, resulting in improved conduction and higher performance. A second development is the employment of low dielectric constant (low k) dielectric materials and/or air gaps within the BEOL interconnect structure. Low k dielectric materials and air gaps have dielectric constants that are lower than those of traditionally used interconnect dielectric materials such as, for example, silicon dioxide, thereby facilitating further scaling down of the BEOL interconnect structure. However, as the BEOL interconnect structures are scaled down, issues concerning oxidation and diffusion of the metal of these nanoscale BEOL interconnect structures are prevalent, and have a deleterious effect on the functioning of the BEOL interconnect structure and, hence, the semiconductor device in which it is incorporated.

SUMMARY

Illustrative embodiments of the present application include techniques for use in semiconductor manufacture to minimize the potential of oxidation and diffusion of metal within the metal interconnect of a nanoscale BEOL structure. In one illustrative embodiment, a method includes forming a metallic interconnect structure on a semiconductor substrate where the metallic interconnect structure comprises a plurality of metal lines with adjacent metal lines separated by a gap therebetween. The method further includes selectively depositing a first low-k dielectric material onto the semiconductor substrate and onto exposed surfaces of the metal lines of the metallic interconnect structure to form a barrier on at least the metal lines. The barrier is configured to minimize oxidation and diffusion of metal of the metal lines. The method also includes depositing a flowable second low-k dielectric material onto the semiconductor substrate to form a dielectric layer encapsulating the barrier and the metallic interconnect structure.

In another illustrative embodiment, a semiconductor structure comprises a semiconductor substrate, a metallic interconnect structure on the semiconductor substrate and a barrier. The metallic interconnect structure comprises a plurality of metal lines with adjacent metal lines separated by a gap therebetween. The barrier is disposed on at least the metal lines of the metallic interconnect structure. The barrier comprises a first low-k dielectric material configured to minimize oxidation and diffusion of metal of the metal lines. A dielectric layer is disposed to encapsulate the barrier and the metallic interconnect structure. The dielectric layer comprises a second low-k dielectric material.

In another illustrative embodiment, an integrated circuit comprises one or more semiconductor structures. The at least one of the one or more semiconductor structures comprises a semiconductor substrate, a metallic interconnect structure on the semiconductor substrate and a barrier. The metallic interconnect structure comprises a plurality of metal lines with adjacent metal lines separated by a gap therebetween. The barrier is disposed on at least the metal lines of the metallic interconnect structure. The barrier comprises a first low-k dielectric material configured to minimize at least one of oxidation and diffusion of metal of the metal lines. A dielectric layer is disposed relative to the semiconductor substrate to encapsulate the barrier and the metallic interconnect structure. The dielectric layer comprises a second low-k dielectric material.

Other embodiments will be described in the following detailed description of embodiments, which is to be read in conjunction with the accompanying figures.

DETAILED DESCRIPTION

Figure 1:
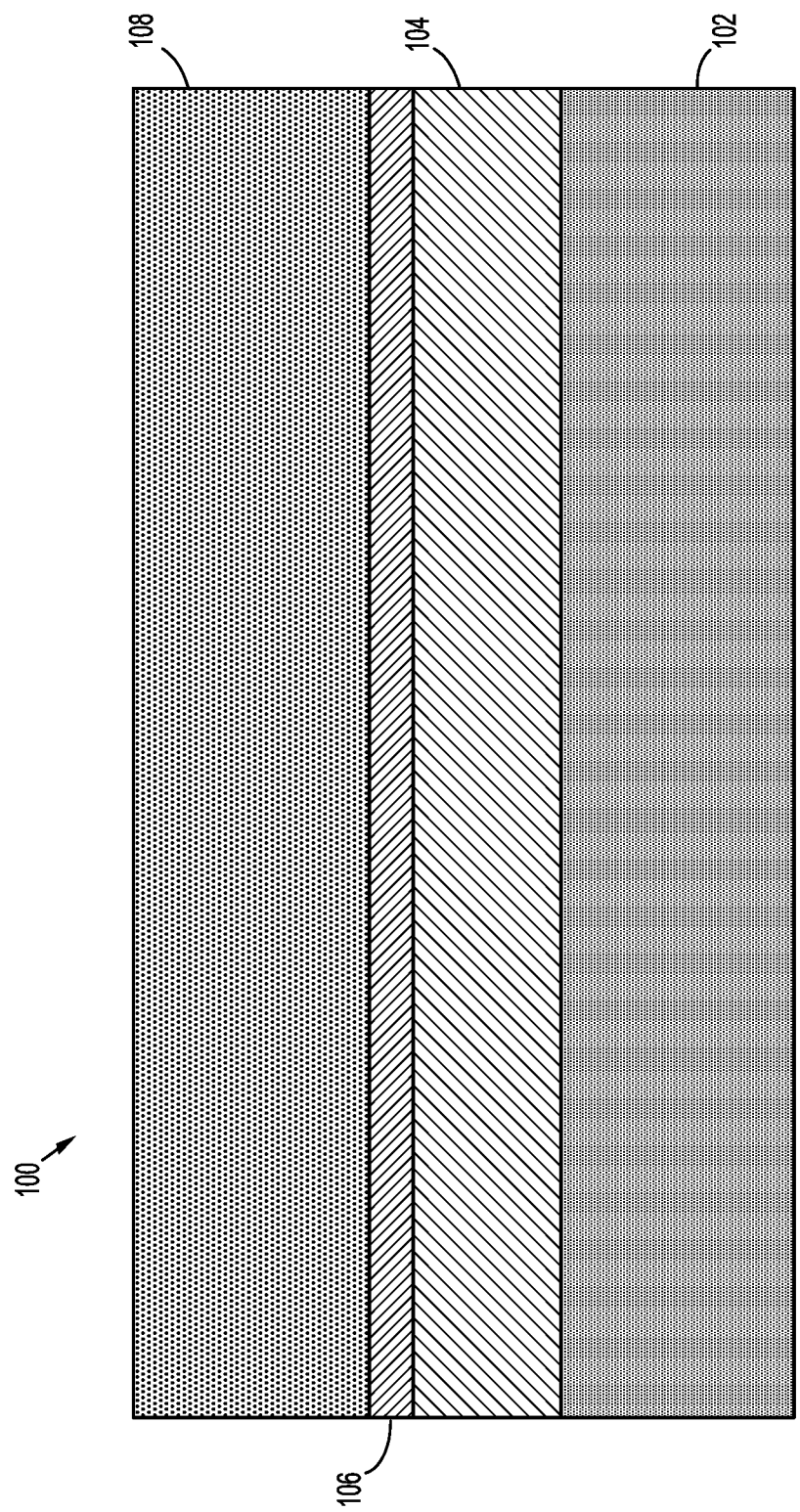
FIG. 1 is a schematic cross-sectional side view of a semiconductor structure at an intermediate stage of fabrication in which a sacrificial dielectric layer is formed on a semiconductor substrate according to one or more illustrative embodiments.

Embodiments will now be described in further detail with regard to semiconductor structures comprising metallic interconnects and having substantially minimal diffusion and oxidation of the metal material forming the interconnect, as well as methods for fabricating semiconductor structures with minimal diffusion and oxidation of the metal forming the interconnect. It is to be understood that the various layers, structures, and regions shown in the accompanying drawings are schematic illustrations that are not drawn to scale. In addition, for ease of explanation, one or more layers, structures, and regions of a type commonly used to form semiconductor structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor structures, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Methods for fabricating metallic interconnects will now be discussed in further detail with reference to FIGS. 1 through 10, which schematically depict illustrative embodiments of a semiconductor structure at various stages of fabrication. To begin, FIG. 1 is a schematic cross-sectional side view of a semiconductor structure 100 at an intermediate stage of fabrication comprising a semiconductor substrate 102 (e.g., semiconductor wafer), a FEOL (front-end-of-line)/MOL (middle-of-line) structure 104 formed on the semiconductor substrate 102, a capping layer 106, and a sacrificial dielectric layer 108. While the semiconductor substrate 102 is illustrated as a generic substrate layer, it is to be understood that the semiconductor substrate 102 may comprise one of different types of semiconductor substrate structures and materials.

For example, in one embodiment, the semiconductor substrate 102 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 102 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL.

The FEOL/MOL structure 104 comprises a FEOL layer formed on the semiconductor substrate 102. The FEOL layer comprises various semiconductor structures and components that are formed in or on the active surface of the semiconductor substrate 102 to provide integrated circuitry for a target application. For example, the FEOL layer comprises field-effect transistor (FET) devices (such as FinFET devices, vertical FET devices, planar FET device, etc.), bipolar transistors, diodes, capacitors, inductors, resistors, isolation devices, etc., which are formed in or on the active surface of the semiconductor substrate 102. In general, FEOL processes typically include preparing the semiconductor substrate 102 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 104 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conductive via contacts (not shown) that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure 104.

In the example process flow illustrated in FIG. 1, the capping layer 106 and sacrificial dielectric layer 108 are formed as part of an initial phase of a BEOL process module to form a first metallization level of a BEOL interconnect structure. The capping layer 106 comprises a layer of insulating/dielectric material such as silicon nitride (SiN), silicon carbide (SiC), silicon carbon nitride (SiCN), hydrogenated silicon carbide (SiCH), or a multilayer stack comprising the same or different types of dielectric materials, etc., or other suitable low-k dielectric materials which are non-reactive with the metallic material that is used to form metallic interconnect structures in the BEOL. In one example embodiment, the capping layer 106 is formed with a thickness in a range of about 2 nm to about 60 nm. The sacrificial dielectric layer 108 can be formed of a dielectric material including, but not limited to, silicon oxide (e.g. $SiO_2$), SiN, hydrogenated silicon oxycarbide (SiCOH), hydrogenated silicon carbon nitride (SiCNH), and other similar types of insulating/dielectric materials or porous dielectrics. The thickness of the sacrificial dielectric layer 108 defines a vertical height (or thickness) of the metallization that is formed within the sacrificial dielectric layer 108, which will vary depending on the application. For example, in one embodiment, the sacrificial dielectric layer 108 is formed with a thickness in a range of about 20 nm to about 800 nm. The capping layer 106 and sacrificial dielectric layer 108 are formed using known deposition techniques, such as, for example, ALD (atomic layer deposition), CVD (chemical vapor deposition) PECVD (plasma-enhanced CVD), or PVD (physical vapor deposition), or spin-on deposition.

Figure 2:
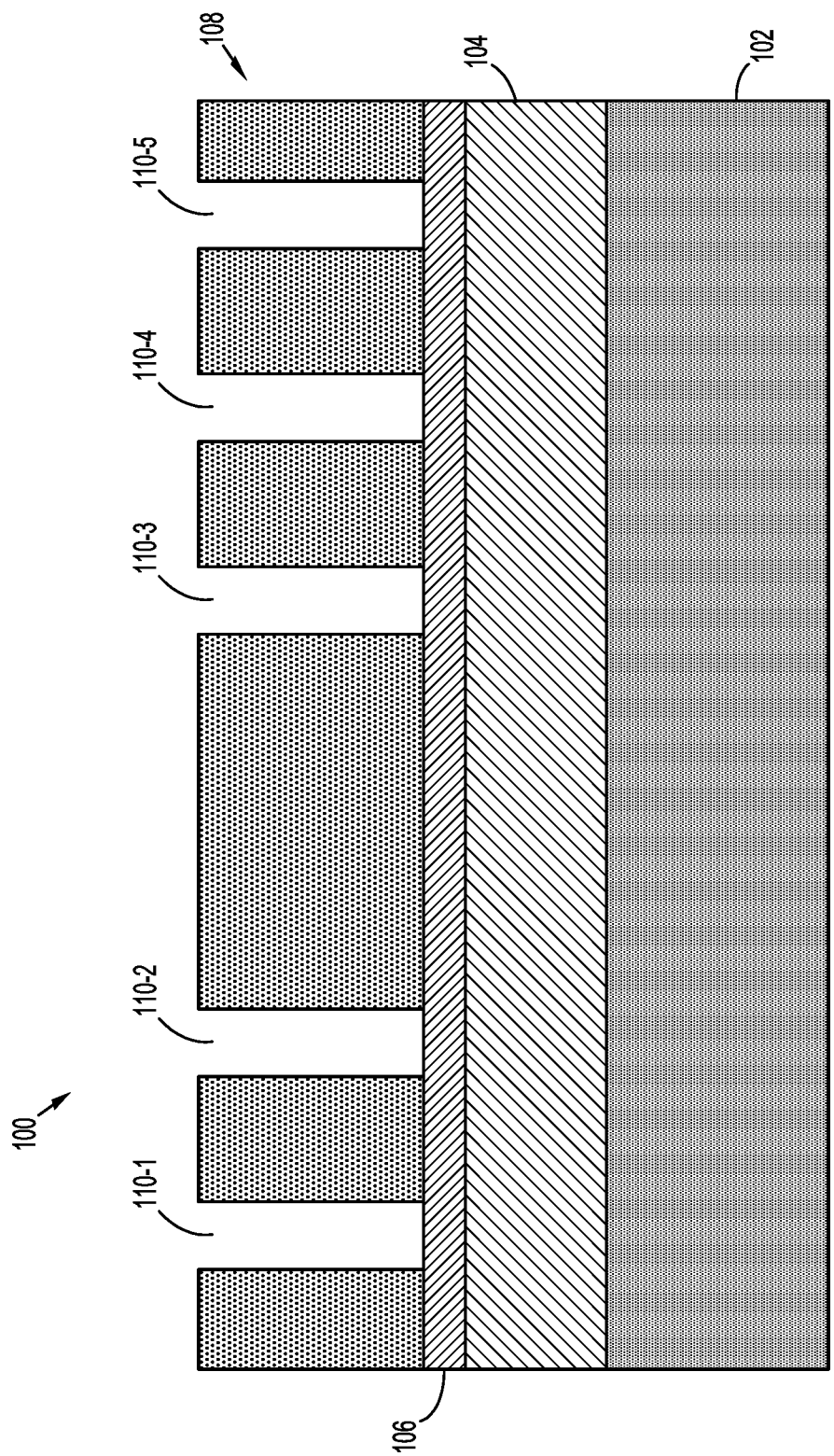
FIG. 2 is a schematic cross-sectional side view of a semiconductor structure after patterning the sacrificial dielectric layer to form a plurality of openings in the sacrificial dielectric layer.

FIG. 2 is a schematic cross-sectional side view of the semiconductor structure 100 shown in FIG. 1 after patterning the sacrificial dielectric layer 108 to form a plurality of openings 110-1 to 110-5 (e.g., trench openings) in the sacrificial dielectric layer 108. In particular, in the example embodiment, the openings 110-1 to 110-5 are narrow whereby the metal lines to be formed define a high aspect ratio. As used herein, the term high-aspect ratio refers to features having a depth to length and/or width of at least about 1:1. In particular embodiments, high-aspect ratio is between about 1:1 to about 3:1 and may be between about 1:1 and about 100:1 in still further embodiments.

For illustrative purposes, FIG. 2 shows the use of a single damascene process in which metallic interconnect structures, e.g., metal lines (wiring) and metallic vias (vertical interconnects) are separately formed in different insulating layers of a BEOL structure. In other embodiments, openings can be etched in the sacrificial dielectric layer 108 and filled with metallic material using one of various "dual" damascene patterning techniques known in the art in which trenches and via openings are patterned in the same dielectric layer and concurrently filled with metallic material. The dual damascene patterning methods include a "via first" process, a "trench first" process, and a "buried via" process, each of which comprises different sequences for etching the dielectric layer 108 to pattern the via openings and trench openings, while concurrently filling the via openings and trench openings with metallic material.

The damascene patterning of the sacrificial dielectric layer 108 can be implemented using any conventional photolithography and etching process, e.g., forming a photoresist mask on the upper surface of the sacrificial dielectric layer 108 which comprises an image of the openings 110-1 to 110-5 to be etched into the sacrificial dielectric layer 108, followed by etching the dielectric material of the sacrificial dielectric layer 108 using a dry etch process such as RIE (reactive ion etching), which has an etch chemistry that is suitable to etch the sacrificial dielectric layer 108 selective to the underlying capping layer 106 (which serves as an etch stop layer). The capping layer 106 insulates the metallization from the underlying PMD layer of the FEOL/MOL layer 104. However, in target locations where the metallization formed in the openings 110-1 to 110-5 will make contact to vertical contacts formed in the underlying FEOL/MOL layer 104, the capping layer 106 can be patterned by etching openings through the capping layer 106 at the bottom of the openings 110-1 to 110-5 at such target locations.

Figure 3:
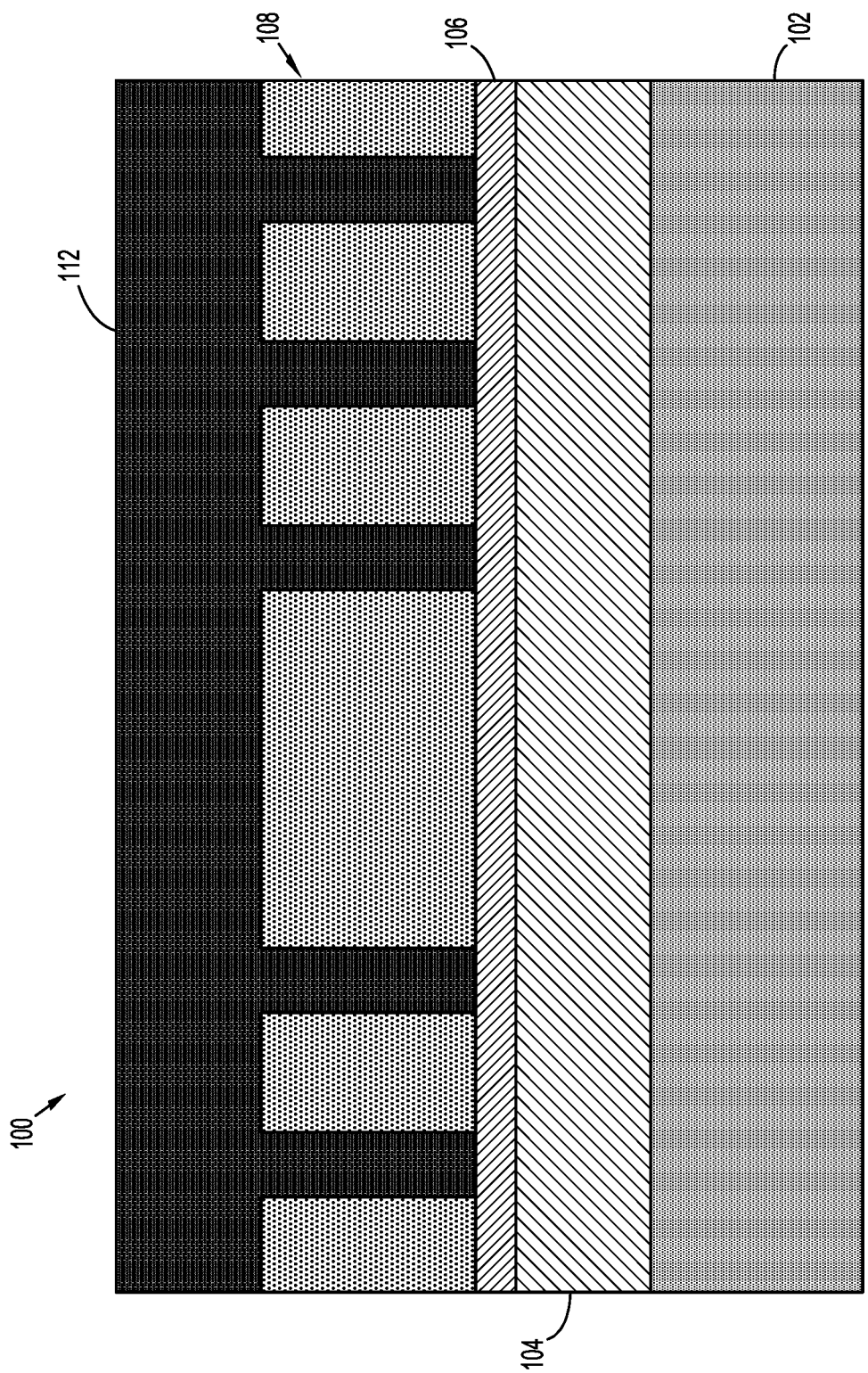
FIG. 3 is a schematic cross-sectional side view of a semiconductor structure after forming a metallic layer to fill the openings in the sacrificial dielectric layer with metallic material according to one or more illustrative embodiments.
Figure 4:
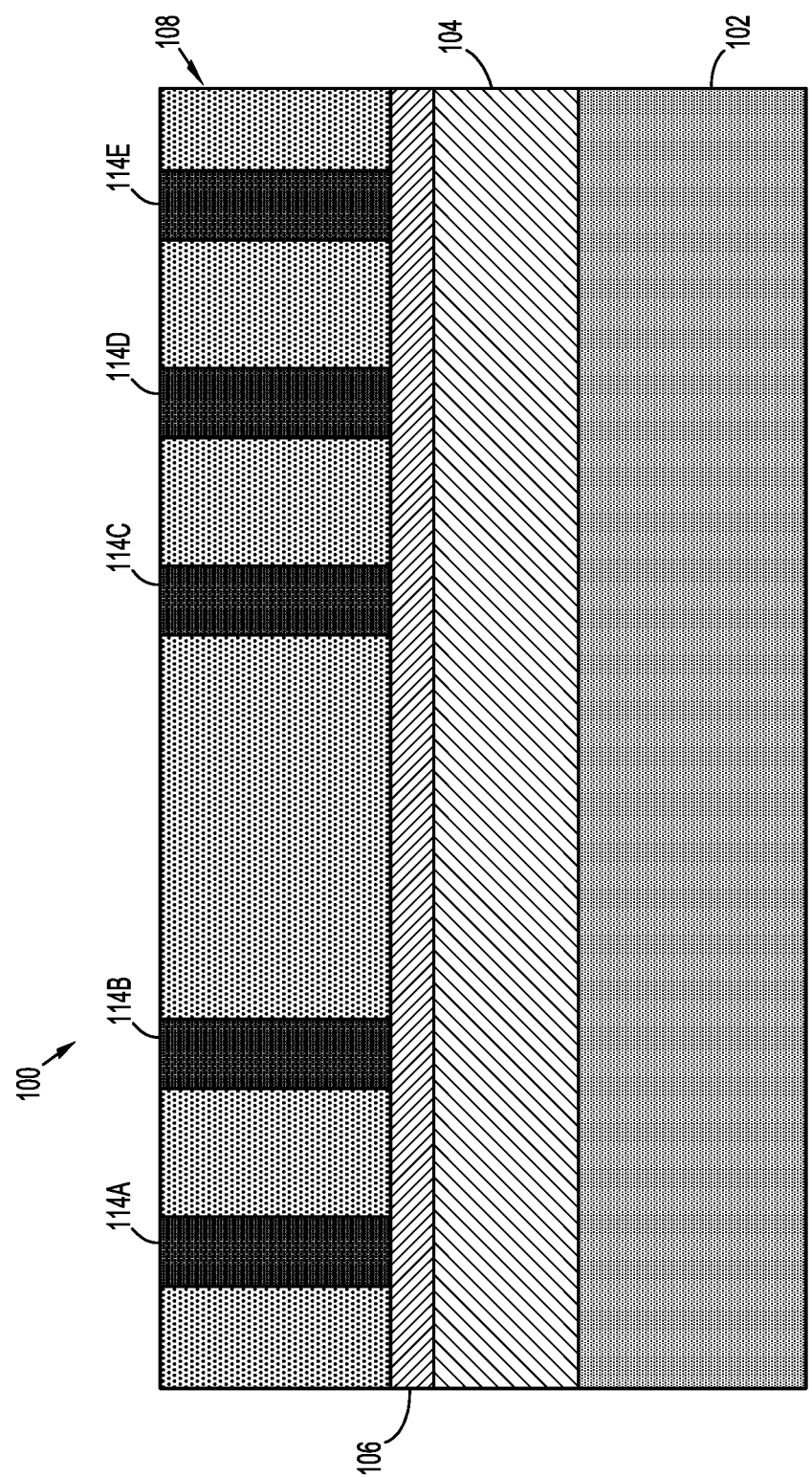
FIG. 4 is a schematic cross-sectional side view of a semiconductor structure after a planarizing process portions of the metallic layer to form metal lines according to one or more illustrative embodiments.

A next phase of the process flow comprises depositing a layer of metallic material to form metallic interconnect structures (e.g., metal lines) in the sacrificial dielectric layer 108, as schematically illustrated in FIGS. 3-4. In particular, FIG. 3 is a schematic cross-sectional side view of the semiconductor structure 100 after forming a layer of metallic material 112 to fill the openings 110-1 to 110-5 in the sacrificial dielectric layer 108. FIG. 4 is schematic cross-sectional side view of the semiconductor structure shown in FIG. 3 after planarizing the surface of the semiconductor structure down to the sacrificial dielectric layer 108 to remove overburden portions of the metallic layer 112, and form a plurality of metal lines 114A-114E. In one illustrative embodiment, the layer of metallic material 112 comprises Copper (Cu). In other embodiments, the metallic material 112 can be, for example, aluminum (Al), tungsten (W), iridium (Ir), cobalt (Co), ruthenium (Ru), or alloys thereof. The layer of metallic material 112 is deposited using known dry deposition techniques such as ALD, PVD or CVD or wet deposition techniques such as electroplating, and electroless plating, etc. The planarization process can be implemented using a chemical-mechanical polish (CMP) process with a suitable etch slurry. The metal lines 114A-114E may include various metallic liners and/or adhesion layers such as, for example tantalum (Ta), tantalum nitride (TaN), titanium nitride (TiN), etc. These liners and or adhesives may be deposited or grown in the openings 110-1 to 110-5 prior to the metallization process.

Figure 5:
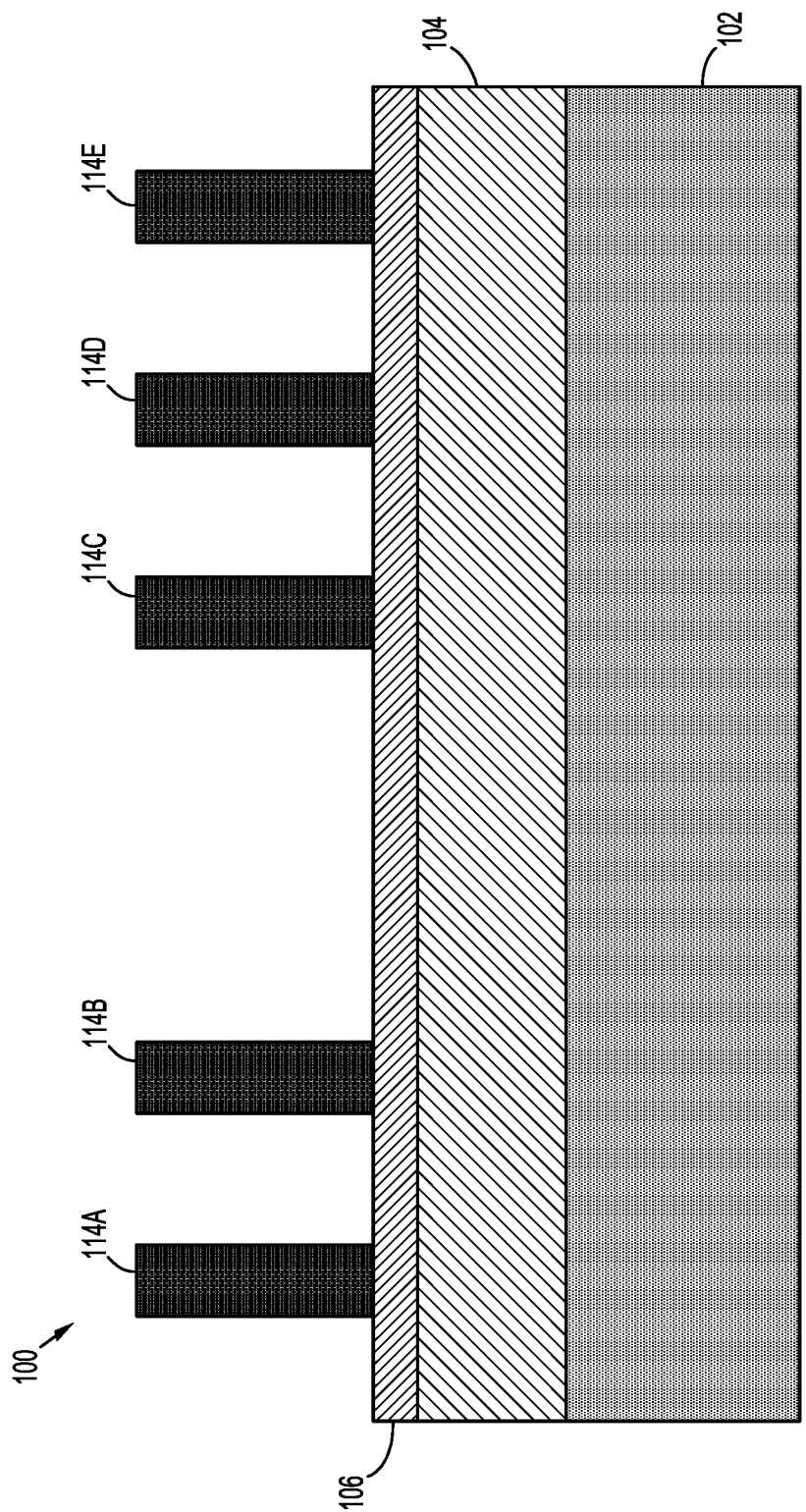
FIG. 5 is a schematic cross-sectional side view of a semiconductor structure subsequent to etching away the sacrificial dielectric layer to expose the metal lines according to one or more illustrative embodiments.

A next phase of the process flow includes removing the sacrificial dielectric layer 108. In particular, FIG. 5 is a schematic cross-sectional side view of the semiconductor structure shown in FIG. 4 after etching away the sacrificial dielectric layer 108. The sacrificial dielectric layer 108 can be removed using any suitable dry etch process, such as a plasma etch process with a chlorine (Cl), fluorine (F), or a fluorocarbon such as carbon tetrafluoride (CF4/C3F8) and in combination with either hydrogen (H2), oxygen (O2), nitrous oxide (N2O), and/or nitrogen (N2) plasma gases. As shown, removal of the sacrificial dielectric layer 108 results in the exposing of all surfaces of the metal lines 114A-114E except for the bottom surfaces of the metal lines 114A-114E. The metal lines 114A-114E may be subjected to a subsequent heat treatment process (e.g., a thermal anneal process). As an option, one or more additional layers may be deposited on each metal line 114A-114E via conventional methodologies. The one or more layers may be relatively thin, for example, less than or equal to about 1 nanometer (nm).

Figure 6:
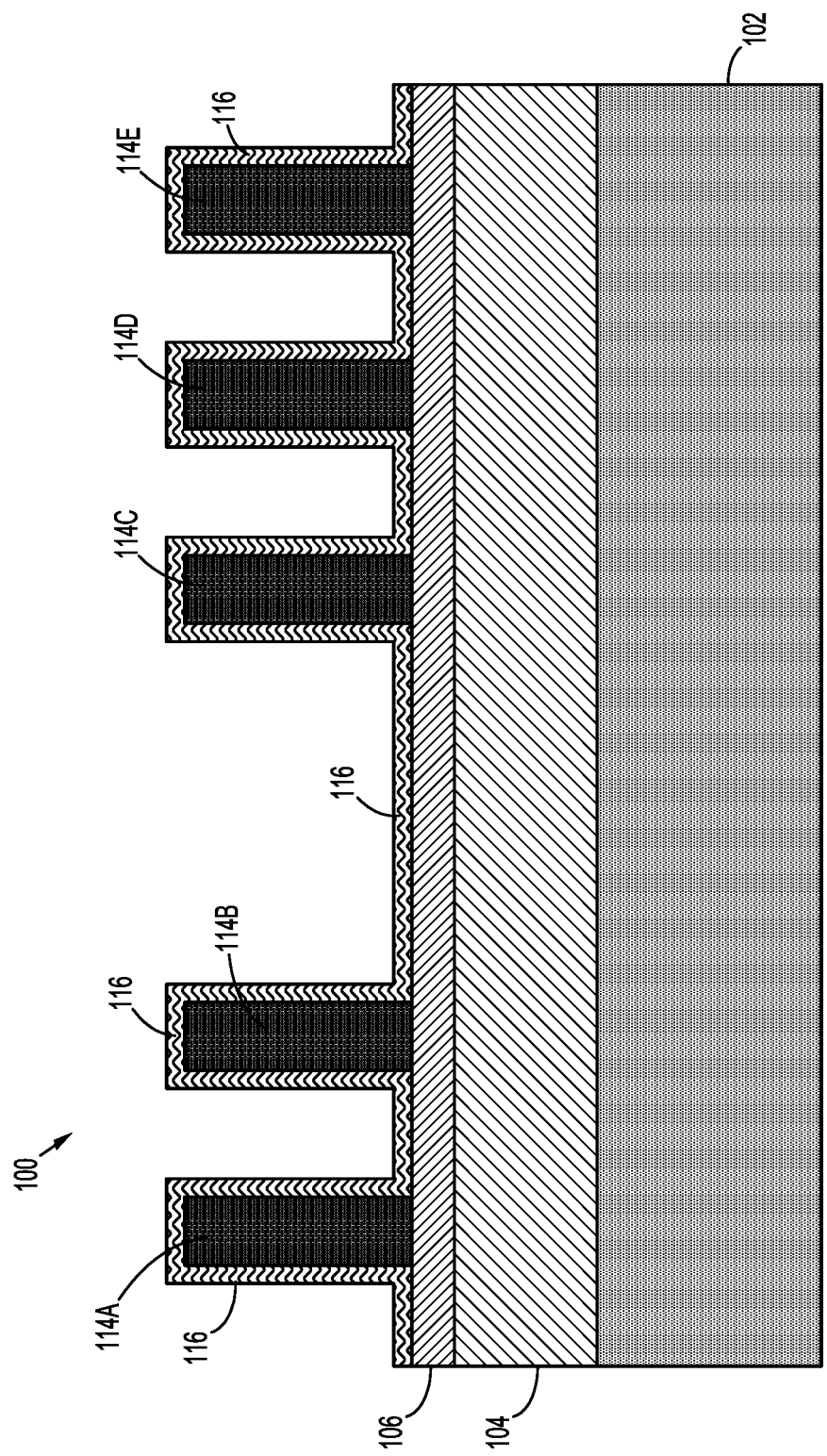
FIG. 6 is a schematic cross-sectional side view of a semiconductor structure subsequent to application of a barrier onto at least the metal lines for minimizing diffusion and oxidation of metal according to one or more illustrative embodiments.

With reference to FIG. 6, a next phase of the process flow comprises forming a barrier 116 around at least the metal lines 114A-114E. In one illustrative embodiment, the barrier 116 is formed by selectively depositing a thin conformal layer of liner material on at least the exposed surfaces of the metal lines 114A-114E. The barrier 116 comprises a low k dielectric material and serves as a metal oxidation/diffusion layer to prevent or substantially eliminate oxidation and diffusion of metallic material of the metal lines 114A-114E into a surrounding dielectric material of an ILD layer that is subsequently formed to encapsulate the metal lines 114A-114E. The barrier 116 includes a carbon-rich (C-rich) silicon carbon-nitride (SiCN) material and/or a porous C-rich SiCN. The selected SiCN material is devoid of oxygen (O2) molecules, and thus, when applied as a layer onto the metal lines 114A-114E functions as a metal oxidation/diffusion barrier 116. The selected SiCN is highly conformable such that the material readily flows to fill the gaps between the high aspect ratio metal lines 114A-114E without any pinch off. In one exemplary methodology of deposition of the SiCN material, the barrier 116 is formed using sequential dielectric film deposition techniques, which enable the formation of highly conformal and stress controlled multilayer ultrathin SiCN dielectric structures that are suitable for use as the barrier 116.

In illustrative embodiments, each layer of the multilayer barrier 116 is formed with a process that includes depositing a conformal first film, for example, a SiCN film using a plasma enhanced chemical vapor deposition (PECVD) process followed by a modulated radio frequency (RF) plasma nitridation treatment. In one illustrative embodiment, the deposition of a SiCN dielectric film is performed with a mixture of trimethyl silane ($C_3H_{10}Si$), ammonia ($NH_3$) and/or ethylene ($C_2H_4$) reactant gases or precursors at suitable standard cubic centimeters per minute (SCCM) flow rates, and using a low RF power and low temperature PECVD process or plasma enhanced atomic layer deposition (PE-ALD) process to form a conformal layer of SiCN having a thickness in a range of about 1.0 nm to about 2 nm. For example, in one embodiment, the SiCN deposition process is performed at a temperature of less than about 450° Centigrade, and a radio frequency power of less than about 2 watts per square centimeter, with a radio frequency ranging from about 400 KHz to about 60 MHz. This deposition process results in the formation of an ultrathin, highly conformal SiCN film.

Thereafter, a modulated RF plasma nitridation process is performed on the deposited SiCN film. In one embodiment, plasma nitridation is performed using a nitrogen bearing reactant gas such as nitrogen (N2) or ammonia (NH3) along with an inert gas such as argon (Ar) or helium (He). The plasma nitridation process serves to make the thin SiCN film more dense by low energy plasma ion bombardment, and to change a stress characteristic of the thin SiCN film (compressive↔tensile). Moreover, the plasma nitridation process can serve to adjust other characteristics of the thin SiCN film such as, e.g., increase a breakdown voltage, reduce leakage, and/or slightly lower the dielectric constant of the SiCN film. The SiCN deposition and plasma nitridation steps are repeated for each layer of SiCN dielectric material that is added to form a multilayer SiCN dielectric stack structure, having a desired total thickness.

Once the desired number of layers or thickness of the SiCN film is achieved, one or more layers of a second film of C-rich SiC (C/Si ratio>1.9) is deposited by a PECVD process with trimethyl silane ($C_3H_{10}Si$) and/or ethylene ($C_2H_4$) as precursors. As an alternative, or additionally porous SiCN (i.e., p-SiCN) may be deposited with dimethylsilacyclopentane (DMSCP), ammonia ($NH_3$) and ethylene ($C_2H_4$) as precursors. After each deposition of the second film, the film is subjected to a nitrogen plasma treatment as described hereinabove. The nitrogen plasma treatment may be short in duration ranging between about 2 seconds to about 3 seconds. If additional layers of SiCN, C-rich SiC and/or p-SiCN or SiNO are to be formed as part of the process for fabricating a multilayer barrier 116 and/or to fill gaps with dielectric material or as an overburden then the afore-described processes are repeated. Once fabrication of the multilayer low k barrier 116 is complete and no other films are to be added, subsequent fabrication processes are performed to complete construction of the target semiconductor structure being formed.

The low-k multi-layer barrier 116 formed in accordance with the aforedescribed process functions as an oxidation barrier and diffusion barrier when the subsequent interlayer dielectric is deposited on the semiconductor structure. In addition, the films produced by the highly conformable barrier 116 enhance coverage of the metal lines 114A-114E, improve etch selectivity and provide a nitrogen rich surface with a reduced pinhole/oxidation barrier 116.

Figure 7:
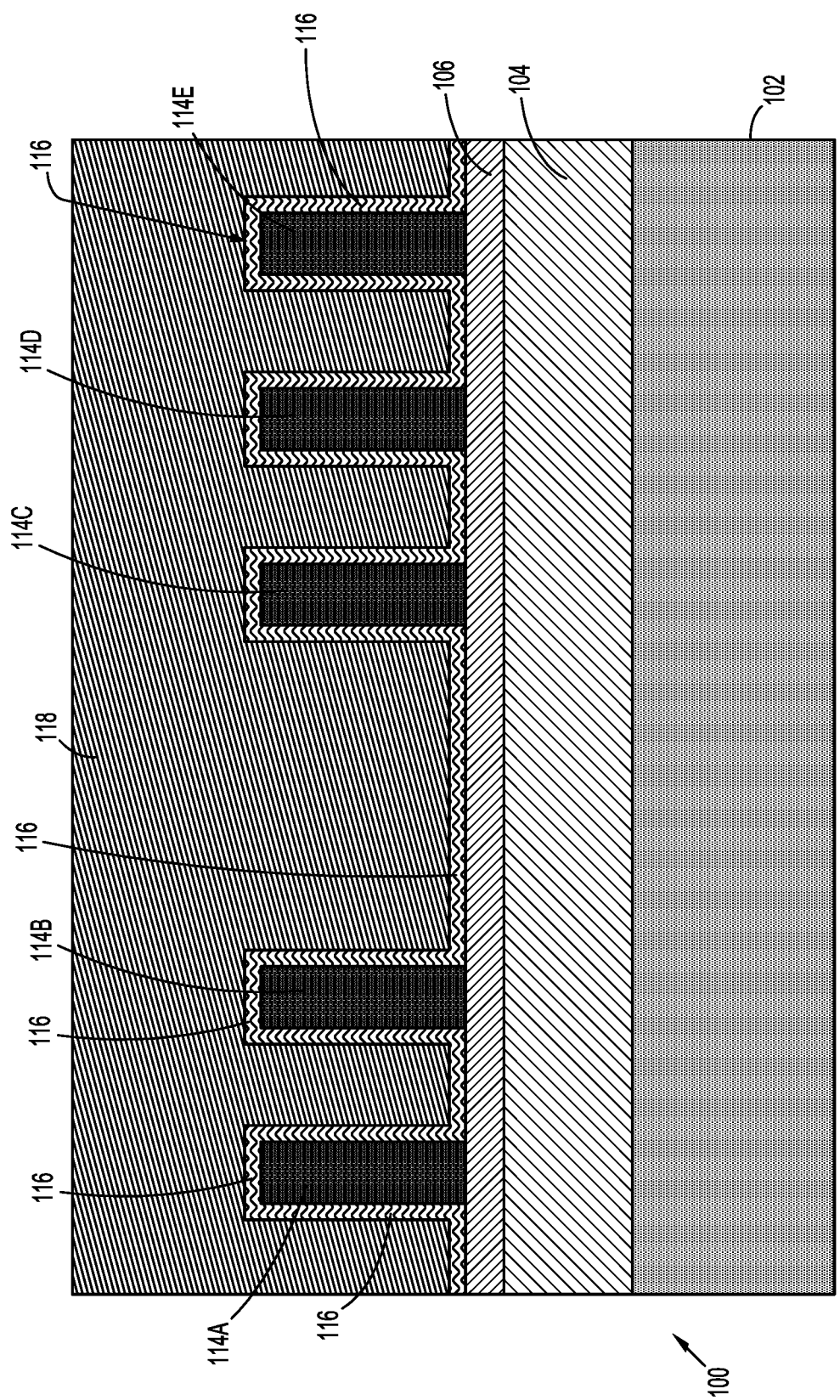
FIG. 7 is a schematic cross-sectional side view of a semiconductor structure subsequent to deposition of a flowable interlevel dielectric according to one or more illustrative embodiments.

With reference to FIG. 7, the process is continued by depositing an interlayer dielectric onto the semiconductor substrate 102 to form an ILD layer 118 enclosing the metal lines 114A-114E and the low k dielectric multi-layer liners 116. The ILD layer 118 is formed of any suitable dielectric material that is commonly utilized in BEOL process technologies. In one exemplative embodiment, the ILD layer 118 comprises a flowable hydrogenated silicon carbon oxide (SiCOH) and/or a flowable hydrogenated C-rich silicon carbon oxide (C-rich SiCOH). These flowable ILD materials provide excellent gap fill, for example, between adjacent metal lines 14A-14E, and enhance planarization requiring minimal chemical-mechanical polish (CMP) processes. The dielectric constant of the SiCOH and C-rich SiCOH may be about 2.7 and 2.55, respectively. Other materials for the ILD layer 118 are also contemplated including silicon oxide ($SiO_2$), silicon nitride (e.g., $Si_3N_4$) SiCH, SiCNH, or other types of silicon-based low-k dielectrics (e.g., k less than about 4.0), porous dielectrics, or known ULK (ultra-low-k) dielectric materials (with k less than about 2.5). The ILD layer 118 may be deposited using known deposition techniques, such as, for example, ALD, PVD, CVD, PECVD, or spin-on deposition. A hard mask and photoresist may be deposited on the ILD layer 118.

It is to be noted that the process flow shown in FIGS. 1 to 7 significantly differs from conventional methods in which the ILD layer is first deposited and patterned to form openings (e.g., trenches), wherein the patterned openings in the ILD layer are then lined with a diffusion barrier, and then filled with metallic material to form metallic interconnect structures (e.g., metal lines or metal vias). In such conventional methods, the diffusion barrier is deposited on the patterned surface of the ILD layer and must be formed with a thickness which is sufficient to accommodate for irregularities of the ILD surface topology, roughness, dielectric porosity, dielectric impurities, etc., to ensure that the diffusion barrier provides sufficient barrier diffusion protection.

In contrast, with the process flow shown in FIGS. 1 to 7, the barrier 116 is selectively deposited directly on the exposed surfaces of the metal lines 114A-114E, followed by the deposition of the dielectric material to form the ILD layer 118. In this regard, the thickness of the barrier 116 can be minimized for its intended purposes, as the thickness of the barrier 116 does not need to be increased to accommodate for irregularities of the ILD surface topology, etc. As such, the metal lines 114A-114E can have a high aspect ratio and be formed with a larger volume of metallic material and conducting area (due to the thinner barrier 116). These features also serve to reduce the resistivity of the metal lines 114A-114E. In other words, in contrast to conventional methods, the metal lines 114A-114E are not formed by filling metallic material into openings (via openings or trenches) in an ILD layer, which are lined by a diffusion barrier that occupies volume in the opening and, thus, reduces the volume of the metallic material (e.g., copper) within the lined openings.

Figure 8:
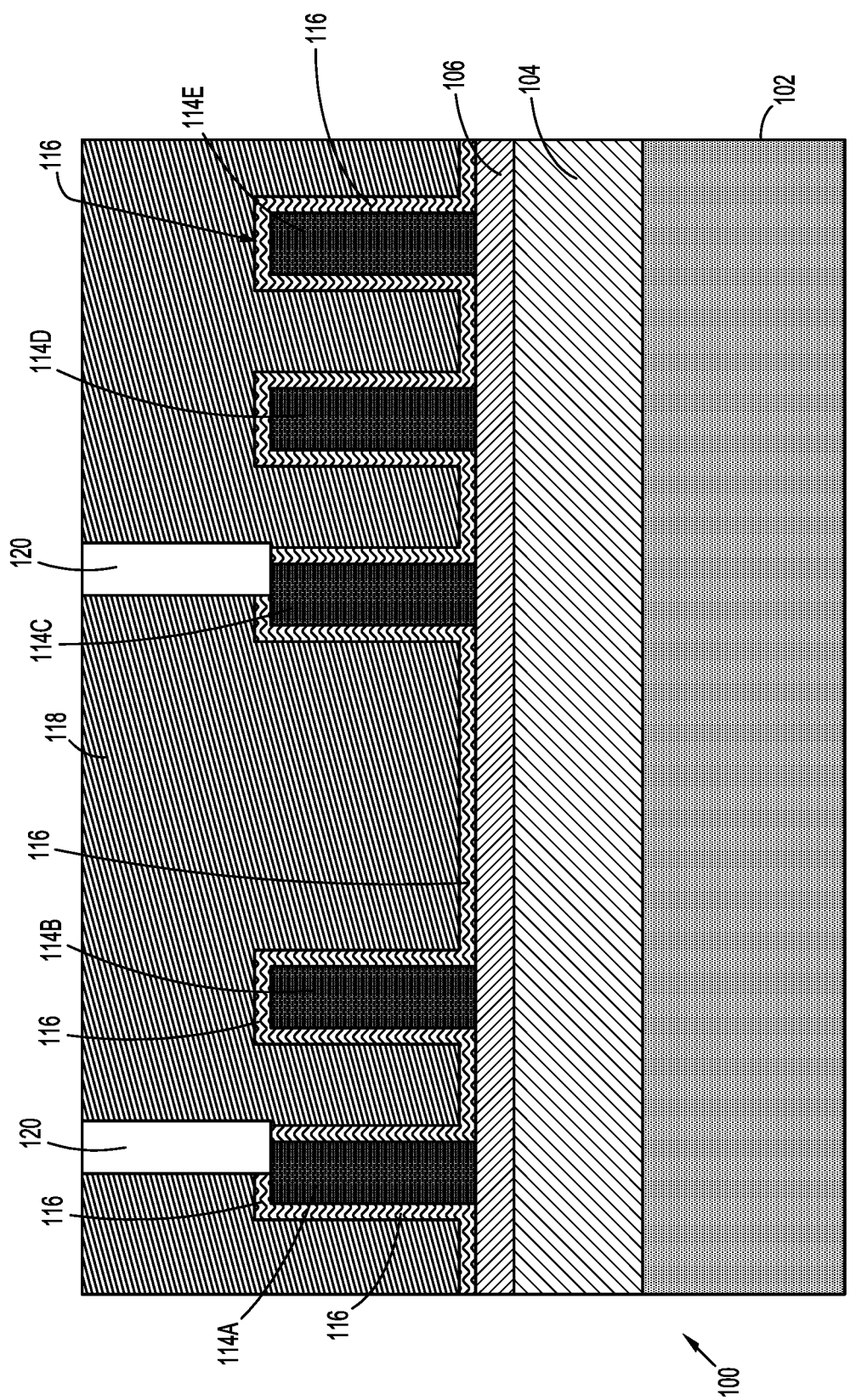
FIG. 8 is a schematic cross-sectional side view of a semiconductor structure subsequent to forming via openings in the interlevel dielectric according to one or more illustrative embodiments.
Figure 9:
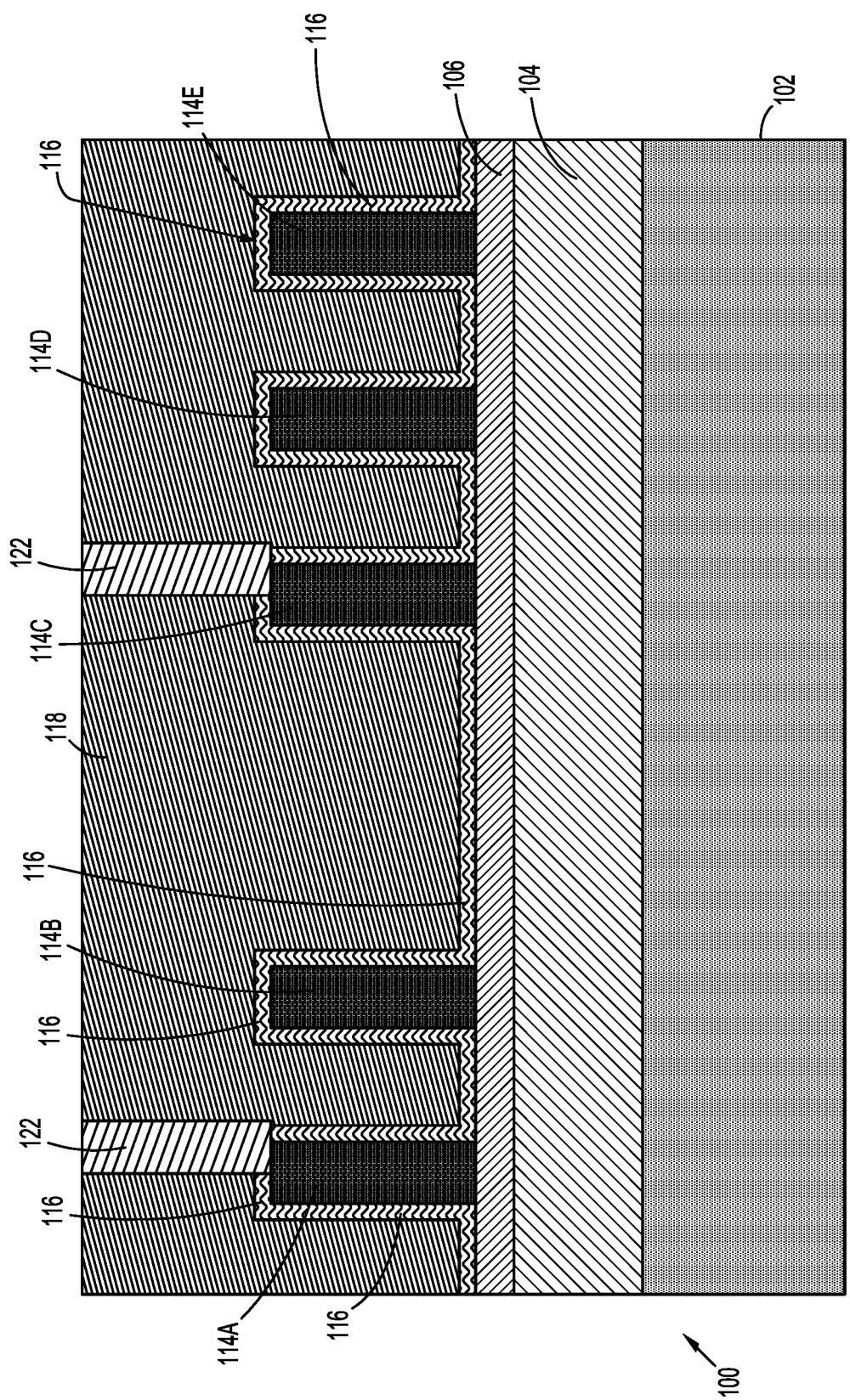
FIG. 9 is a schematic cross-sectional side view of a semiconductor structure subsequent to depositing metallic material to form vias in the interlevel dielectric in contact with at least some of the metal lines according to one or more illustrative embodiments.
Figure 10:
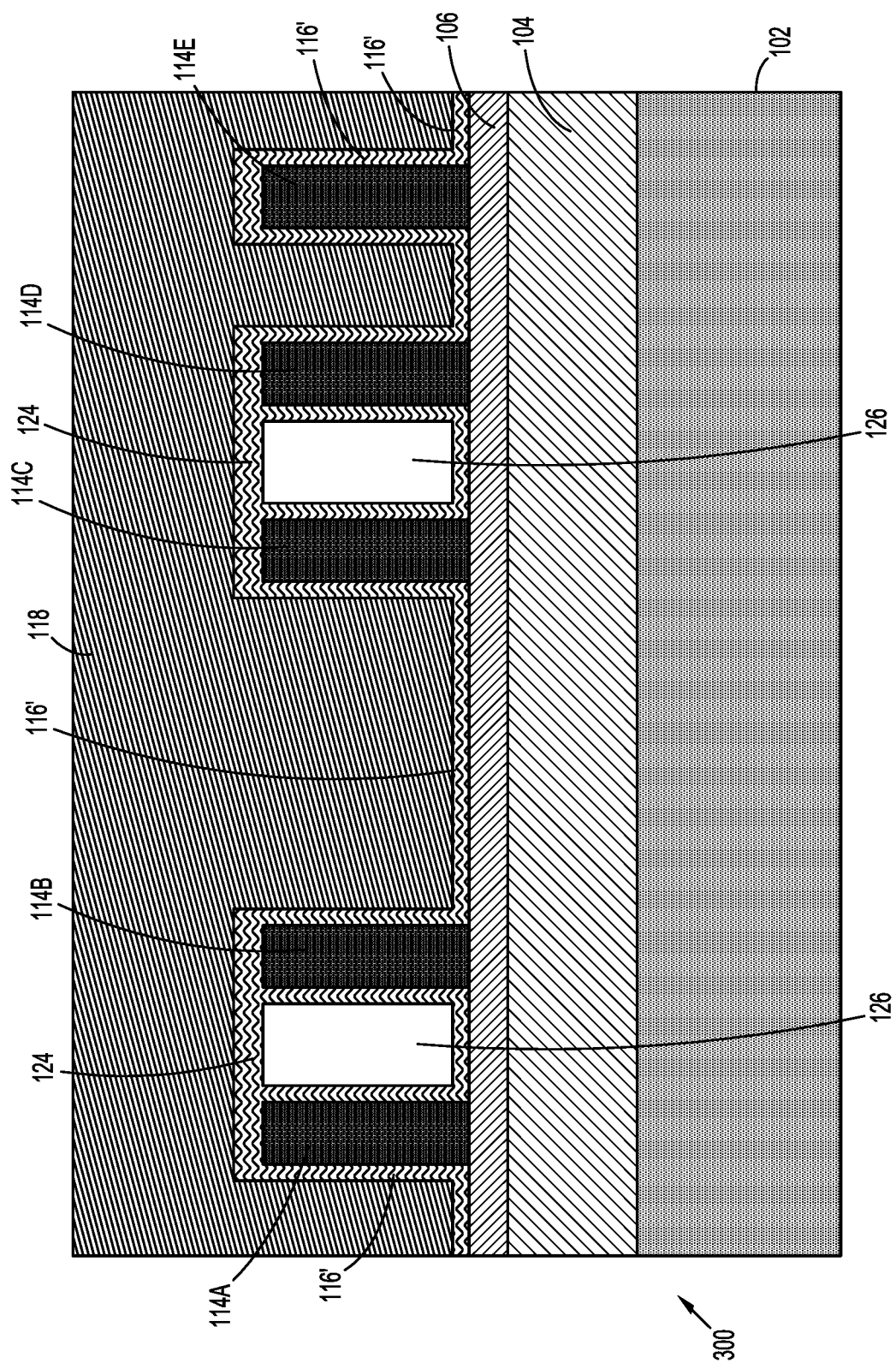
FIG. 10 a schematic cross-sectional side view of a semiconductor structure illustrating an alternate barrier and with air gaps formed in the dielectric material between adjacent metal lines according to one or more illustrative embodiments.

With reference to FIGS. 8-9, the process is continued by forming via openings 120 within the dielectric (FIG. 8) and filling the via openings 120 with a metallic material to form one or more vias 122 (FIG. 9) which communicate with select ones of the metal lines 114A-114E. Conventional photolithography, etching and deposition processes may be utilized to form the vias 122. As depicted, by enabling a small pitch and high aspect ratio of the metal lines 114A-114E, misalignment of the one or more vias 122 is not problematic, i.e., the one or more vias 122 may be off center with respect to the select ones of the metal lines 114A-114E. In addition, the formed semiconductor structure realizes an increased Vmax and improved Vx-Mx (via to metal) time dependent dielectric breakdown (TDDB). These features are realized at least in part by the presence of the metal diffusion oxidation barrier 116 incorporating the C-rich SiCN dielectrics. Other high Vmax insulators such as conformal SiN, conformal cyclic SiCN or even conformal AlOx/SiCOH composites can also be implemented for the same application.

In another illustrative embodiment, an air-gap integration process can be implemented to form air gaps between closely spaced metal lines 114A-114E. For example, with reference to FIG. 10, the semiconductor structure 300 includes a barrier 116' having additional layers formed in accordance with the process outlined in FIGS. 1-7 to provide a thicker barrier 116'. In one methodology, the ILD layer 118 may be deposited over the semiconductor structure 300 shown in FIG. 10 using a non-conformal deposition process (e.g., chemical vapor deposition (CVD) or Plasma-enhanced chemical vapor deposition (PECVD), which results in the formation of "pinch-off" regions 124 in the layer of dielectric material above the small spaces between closely spaced metal lines 114A-114E. The wider spaces between the metal lines 114A-114E will be filled. The pinch-off regions 124 substantially prevent inflow of the subsequently applied dielectric liner thereby providing air gaps 126 between the adjacent metal lines 114A-114E as separated by the barrier layers 116'. The dielectric constant of air is about unity, which is less than the dielectric constant of the dielectric material of the ILD layer 118. As such, the resulting "air spacer" formed by the air gap 126 further minimize oxidation and diffusion of the metal lines 114A-114E, and enhance electrical performance by reducing parasitic capacitance between the closely spaced metal lines 114A-114E. In illustrative embodiments, the effective dielectric constant of the dielectric materials with the air gap ranges from about 2.2 to about 2.4. The semiconductor structure 300 may be subjected to the processes of FIGS. 8-9 to form a BEOL structure as discussed hereinabove.

It is to be understood that the methods discussed herein for fabricating low-resistivity metallic interconnect structures (e.g., copper BEOL interconnect structures) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method, comprising:
   forming a metallic interconnect structure on a semiconductor substrate, the metallic interconnect structure comprising a plurality of metal lines, adjacent metal lines separated by a gap therebetween;
   selectively depositing a first low-k dielectric material onto the semiconductor substrate and onto exposed surfaces of the metal lines of the metallic interconnect structure to form a barrier on at least the metal lines, the barrier configured to minimize oxidation and diffusion of metal of the metal lines; and
   depositing a flowable second low-k dielectric material onto the semiconductor substrate to form a dielectric layer encapsulating the barrier and the metallic interconnect structure;
   wherein the barrier layer extends between upper surfaces of at least a given pair of adjacent metal lines to form an air gap between the given pair of adjacent metal lines of the metallic interconnect structure.

2. The method of claim 1, wherein the first low-k dielectric material has a dielectric constant less than 3.3.

3. The method of claim 2 wherein the first low-k dielectric material comprises carbon rich silicon carbon nitride.

4. The method of claim 2, wherein the first low-k material comprises porous carbon rich silicon carbon nitride.

5. The method of claim 3, wherein the second low-k dielectric material has a dielectric constant less than 2.7.

6. The method of claim 5, wherein the second low-k material comprises hydrogenated silicon carbon oxide.

7. The method of claim 6, wherein the second low-k material comprises carbon rich hydrogenated silicon carbon oxide.

8. The method of claim 1, including filling the gaps between the adjacent metal lines of the metallic interconnect structure with the second low-k dielectric material.

9. The method of claim 1, wherein the metallic interconnect structure comprises one of copper, aluminum, tungsten, iridium, tantalum, cobalt, ruthenium and rhodium.

10. The method of claim 1, wherein the dielectric layer is an interlayer dielectric layer of a back-end-of-line structure.

11. The method of claim 1 wherein the second low-k dielectric material is different from the first low-k dielectric material.

12. The method of claim 1 wherein the semiconductor substrate comprises at least one of a front-end-of-line structure and a middle-end-of-line structure.

13. The method of claim 1 further comprising forming a capping layer on the semiconductor substrate wherein the metallic interconnect structure includes the capping layer.

14. The method of claim 1 wherein the step of forming comprises forming metal lines each having a high-aspect ratio defining a depth to width ratio of at least 3:1.

15. The method of claim 1 wherein the step of selectively depositing comprises a sequential deposition process to form multiple barrier layers, the multiple barrier layers forming the barrier.

16. The method of claim 1 further comprising forming one or more via openings extending through the dielectric layer and depositing a metallic material to form one or more vias in communication with one or more select metal lines of the metallic interconnect structure.

17. The method of claim 16 wherein the one or more vias is off-center with respect to the one or more select metal lines of the metallic interconnect structure.

18. A semiconductor structure formed in accordance with steps recited in claim 1.

19. The method of claim 1 wherein selectively depositing the first low-k dielectric material includes directly depositing the first low-k dielectric material onto exposed surfaces of the metal lines.

* * * * *